United States Patent
Hwang et al.

(10) Patent No.: US 6,417,097 B1
(45) Date of Patent: Jul. 9, 2002

(54) METHODS OF FORMING A CONTACT STRUCTURE IN A SEMICONDUCTOR DEVICE

(75) Inventors: Min-Wk Hwang, Seoul; Jun-Yong Noh, Inchun, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/754,266

(22) Filed: Jan. 5, 2001

(30) Foreign Application Priority Data

Aug. 28, 2000 (KR) ......................... 2000-50108

(51) Int. Cl.[7] ......................................... H01L 21/4763
(52) U.S. Cl. .................... 438/637; 438/773; 438/783
(58) Field of Search .............................. 438/637–640, 438/612–613, 675, 238–240, 253–256, 381, 396–399, 770, 773

(56) References Cited

U.S. PATENT DOCUMENTS 5,292,677 A  *  3/1994  Dennison ................... 257/296
5,338,700 A  *  8/1994  Dennison et al. ........... 257/296
5,362,666 A  * 11/1994  Dennison .................... 438/396
5,498,562 A  *  3/1996  Dennison et al. ........... 438/253
5,500,544 A  *  3/1996  Park et al. .................. 257/296
5,652,164 A  *  7/1997  Dennison et al. ........... 438/396
5,705,438 A  *  1/1998  Tseng ......................... 438/238
6,261,953 B1 *  7/2001  Uozumi ..................... 427/419.2
6,287,954 B1 *  9/2001  Ashley et al. ............... 438/618
6,303,505 B1 * 10/2001  Ngo et al. ................... 438/626

FOREIGN PATENT DOCUMENTS

JP          6-20989          1/1994

* cited by examiner

Primary Examiner—Olik Chaudhuri
Assistant Examiner—Thanh Nguyen
(74) Attorney, Agent, or Firm—Volentine Francos, P.L.L.C.

(57) ABSTRACT

A method of forming a contact structure in a semiconductor device includes forming an interlayer insulating layer containing impurities on a semiconductor substrate. The interlayer insulating layer is patterned to form a pad contact hole. The pad contact hole is filled with a conductive pad. Thermal oxidation annealing is then carried out to form an oxide layer on a top surface of the conductive pad and at an interface between the conductive pad and the interlayer insulating layer.

13 Claims, 16 Drawing Sheets

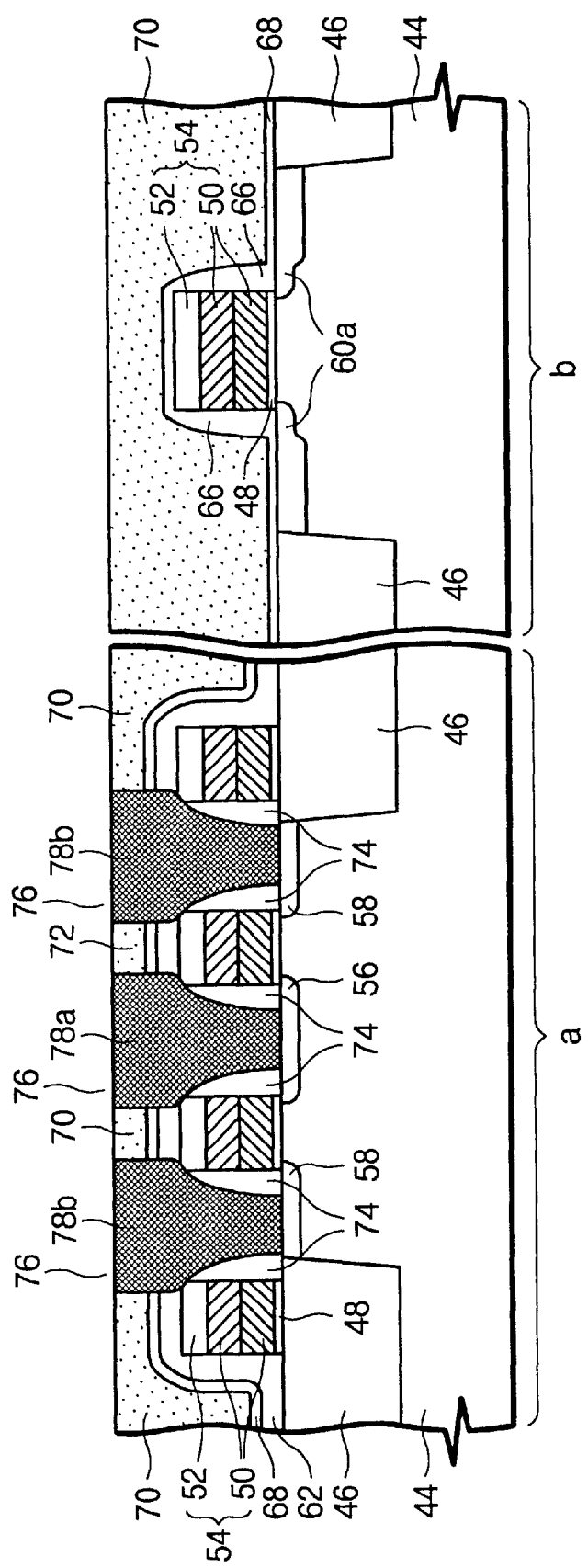

METHODS OF FORMING A CONTACT STRUCTURE IN A SEMICONDUCTOR DEVICE

This application relies for priority upon Korean Patent Application No. 2000-50108, filed on Aug. 28, 2000, the contents of which are incorporated herein by reference in their entirety.

FIELD OF THE INVENTION

The present invention relates to methods of forming a semiconductor device, and more particularly to methods of forming a contact structure in a semiconductor device.

BACKGROUND OF THE INVENTION

As the integration density of a semiconductor device increases, the width of each wiring line, and the space between the adjacent wiring lines, become smaller and smaller in size. Given these increasing smaller requirements, a self-aligned contact technique has been proposed in order to increase alignment margins during a photolithography process for forming a contact hole.

In a Dynamic Random Access Memory (DRAM) device, a bit line and a storage node are electrically connected to active regions of a semiconductor substrate through self-aligned contact pads. The pads penetrate a predetermined region of an interlayer insulating layer and contact the active regions.

In present methods, an oxide layer containing impurities is widely used as the interlayer insulating layer, since it provides for excellent planarization and electrical insulation. Typically, a BPSG (BoroPhosphoSilicate glass) layer is used as the interlayer insulating layer. The BPSG layer is a silicon oxide layer containing impurities such as boron and phosphorous. The BPSG layer has an excellent reflow characteristic, a low dielectric constant, low stress, and excellent step coverage characteristics as compared to other oxide layer not containing impurities. The BPSG layer is generally reflowed at a temperature of about 850° C. to 1000° C. in order to planarize a top surface thereof.

Despite the advantages of the BPSG layer, there some problems in the contact structure formed in the BPSG layer. FIGS. 1 and 2 are cross-sectional views of a conventional contact structure using the BPSG layer as an interlayer insulating layer.

Referring to FIGS. 1 and 2, a trench isolation layer 3 is formed in a semiconductor substrate 1 to define active regions. A drain region 5 and a source region 7 are formed in the active region. A gate pattern 9 is formed, for example, a word line pattern comprising a gate oxide layer 9a, a polysilicon pattern 9b, a metal silicide pattern 9c, and a capping insulating layer pattern 9d which are sequentially stacked. The gate pattern 9 contacts the active regions and bridges the drain region 5 and source region 7. The gate pattern 9 is then covered with a conformal silicon nitride layer 11. The silicon nitride layer 11 is then covered with a BPSG layer 13, filling gap regions between the gate patterns 9. The BPSG layer 13 and the silicon nitride layer 11 are selectively etched in a self-aligned manner, to form a pad contact hole exposing the drain region 5. A conductive layer, such as a doped polysilicon layer, is formed in the pad contact hole to form a bit line pad 15. An insulating layer 17 is formed on the resultant structure having the bit line pad 15, and the insulating layer 17 is then patterned to form a bit line contact hole 19 exposing the bit line pad 15. A polycide bit line 21, a composite layer of a polysilicon layer pattern 21a and a metal silicide layer pattern 21b, is formed on the insulating layer 17. The bit line 21 is electrically connected to the bit line pad 15 through the bit line contact hole 19. At this time, the bit line pad 15 is in contact with the BPSG layer 13 and the drain region 5. Accordingly, impurities such as phosphorous within the BPSG layer 13 are diffused into the drain region 5 through the bit line pad 15 during subsequent annealing process. As a result, the concentration profile of the drain region 5 is changed, thereby degrading electrical characteristics of the semiconductor device.

In order to solve the above problem, Japanese laid-open patent number 6020989 discloses a method of forming a pad. This method comprises forming a contact hole penetrating a portion of a BPSG layer, forming a silicon oxide spacer on a sidewall of the contact hole, and then forming a conductive pad in the contact hole surrounded by the spacer. However, this method also has some problems associated with sidewall spacer formation. Namely, it is very difficult to form the sidewall spacer in a contact hole having a high aspect ratio. In addition, the active region can be damaged during an etch back process employed while forming the sidewall spacer.

SUMMARY OF THE INVENTION

It is an object of the present invention to provide a method of forming a contact structure in a semiconductor device which can prevent impurities in the interlayer insulating layer from being diffused into source/drain region.

In order to achieve the above object and other features of the present invention, a method of forming a contact structure is provided. The method includes forming an interlayer insulating layer containing impurities on a semiconductor substrate. The interlayer insulating layer is patterned to form a pad contact hole exposing a predetermined portion of the semiconductor substrate. A conductive pad is formed in the pad contact hole. The resultant structure having the conductive pad is subjected to thermal oxidation to form a thermal oxide layer on a top surface of the conductive pad and at an interface between the conductive pad and the interlayer insulating layer.

Preferably, prior to formation of the interlayer insulating layer, a plurality of insulated interconnection patterns, which are parallel to each other, are formed on the semiconductor substrate, and an etch stop layer is formed on the entire surface of the resultant structure having the interconnection patterns. Herein, the plurality of interconnection patterns are formed by sequentially forming an insulating layer, a conductive layer and a capping layer on the semiconductor substrate and sequentially patterning the capping layer and the conductive layer. Accordingly, each of the interconnection patterns comprises an interconnection and a capping layer pattern stacked on the interconnection. The insulating layer can also be patterned. The interconnection may correspond to a word line of a DRAM device.

BRIEF DESCRIPTION OF THE DRAWINGS

The invention may be understood and its objects will become apparent to those skilled in the art by reference to the accompanying drawings as follows:

FIGS. 4A–10A are cross-sectional views taken along line I—I of FIG. 3, at selected stages of a method of forming a contact structure according to the present invention;

FIGS. 4B–10B are cross-sectional views taken along line II—II of FIG. 3, at selected stages of a method of forming a contact structure according to the present invention; and FIGS. 4C–10C are cross-sectional views taken along line III—III of FIG. 3, at selected stages of a method of forming a contact structure according to the present invention.

DETAILED DESCRIPTION OF THE PREFERRED EMBODIMENTS

Figure 1:
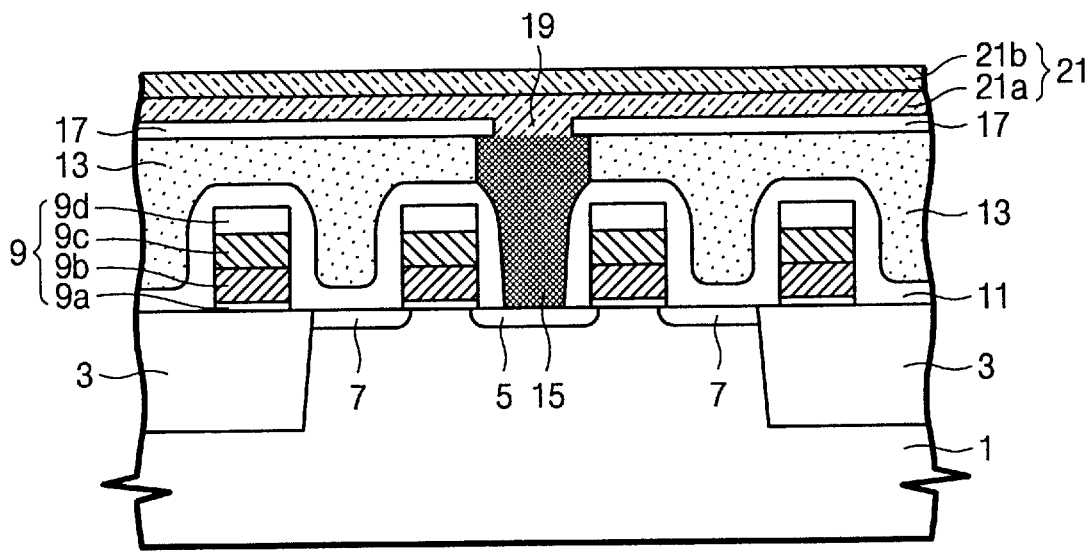
FIG. 1 is a schematic cross-sectional view of a bit line contact structure taken along the direction across word lines of a conventional DRAM.
Figure 2:
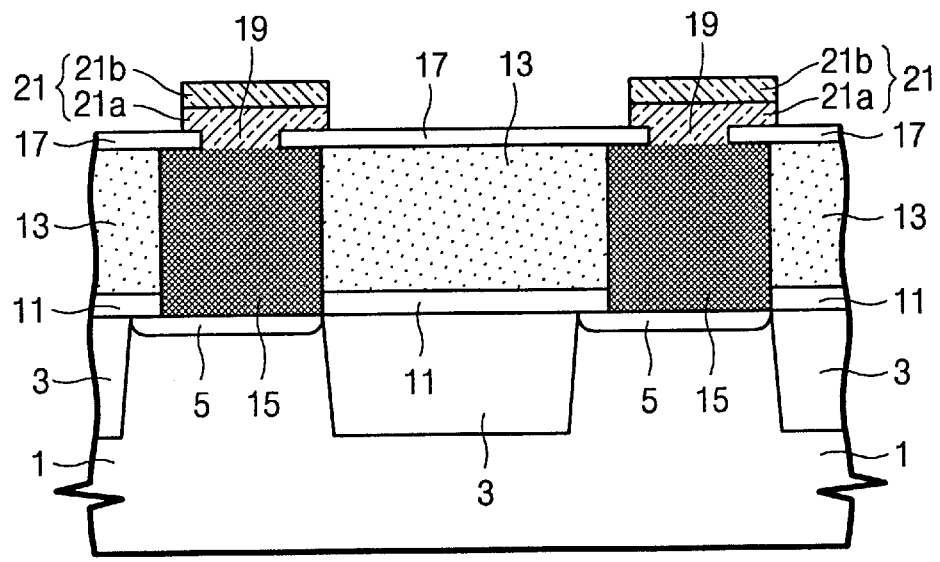
FIG. 2 is a schematic cross-sectional view of a bit line contact structure taken along the direction across bit lines of a conventional DRAM.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Hereinafter, the preferred embodiment of the present invention will be fully described with reference to FIG. 3, FIGS. 4A to 10A, FIGS. 4B to 10B, and FIGS. 4C to 10C. In FIGS. 4A to 10A, reference character 'a' represents a cell array region and reference character 'b' represents a peripheral circuit region.

Figure 3:
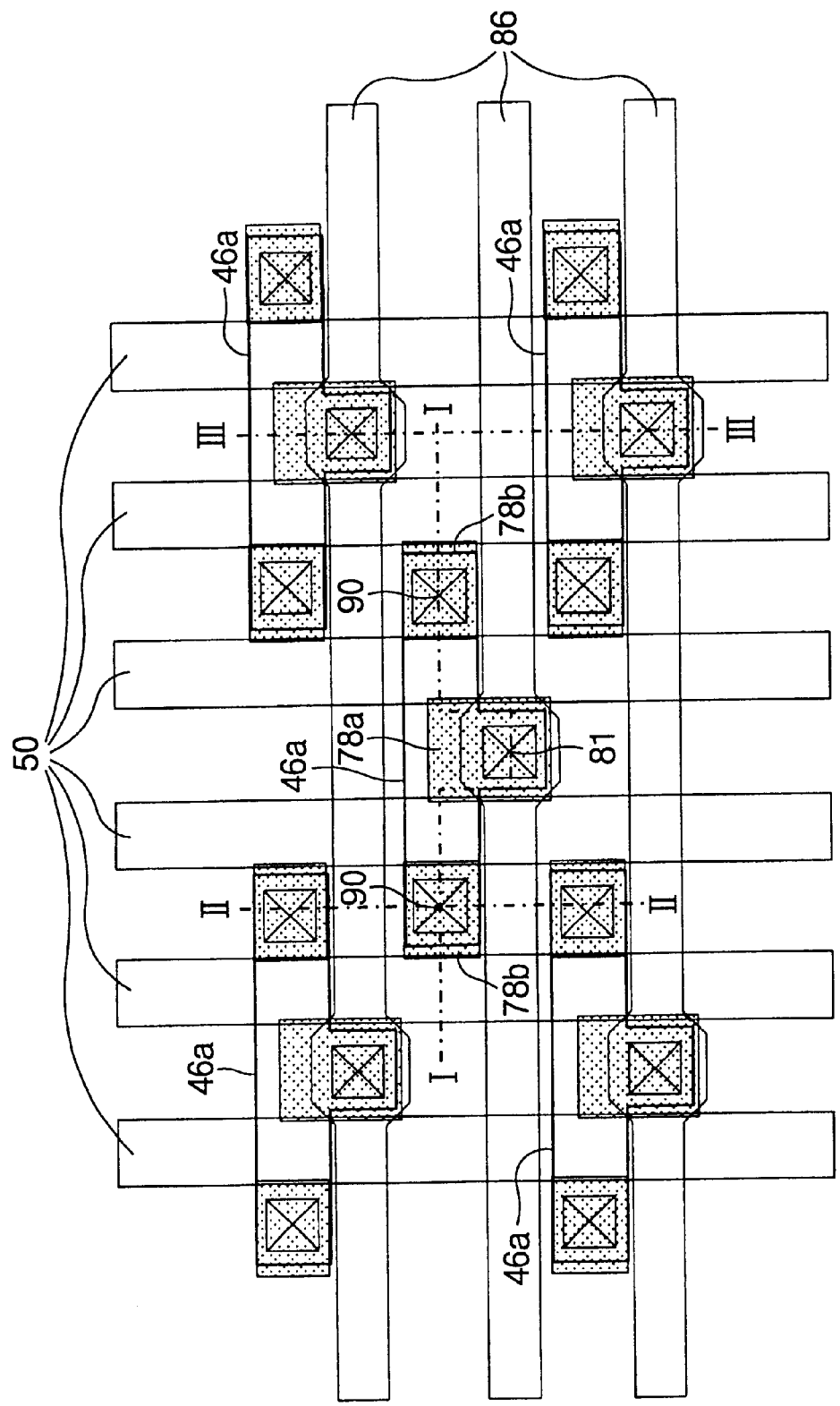
FIG. 3 is a top plan view showing a typical DRAM cell array region.

FIG. 3 is a typical top plan view of a DRAM cell array region. Referring to FIG. 3, a plurality of T-shaped active regions 46a are defined by the isolation region (not shown). A plurality of parallel word lines 50 cross over the active regions 46a. Each active region 46a is divided into three regions by a pair of word lines 50. A common drain region is located at the active region between the pair of the word lines 50. Two source regions are located at both sides of the common drain region.

A bit line pad 78a is disposed on the common drain region, and a storage node pad 78b is disposed on each source region. A plurality of bit lines 86 are disposed to cross over the word lines 50. The bit line 86 is electrically connected to the bit line pad 78a through a bit line contact hole 81. A storage node, namely, a lower electrode of a capacitor is formed on the storage node pad 78b. The storage node is electrically connected to the storage node pad 78b through a storage node contact hole 90. The T-shaped active regions 46a can be modified into various configurations, including but not limited to a bar shape or a diagonal shape, in order to realize high integration density.

Formation of the contact structure shown in FIG. 3 will now be described. For better understanding of the present invention, three cross-sectional views at the same fabrication stages, for example, FIGS. 4A and 4B and 4C will be simultaneously referred to in the discussion.

Figure 4A:
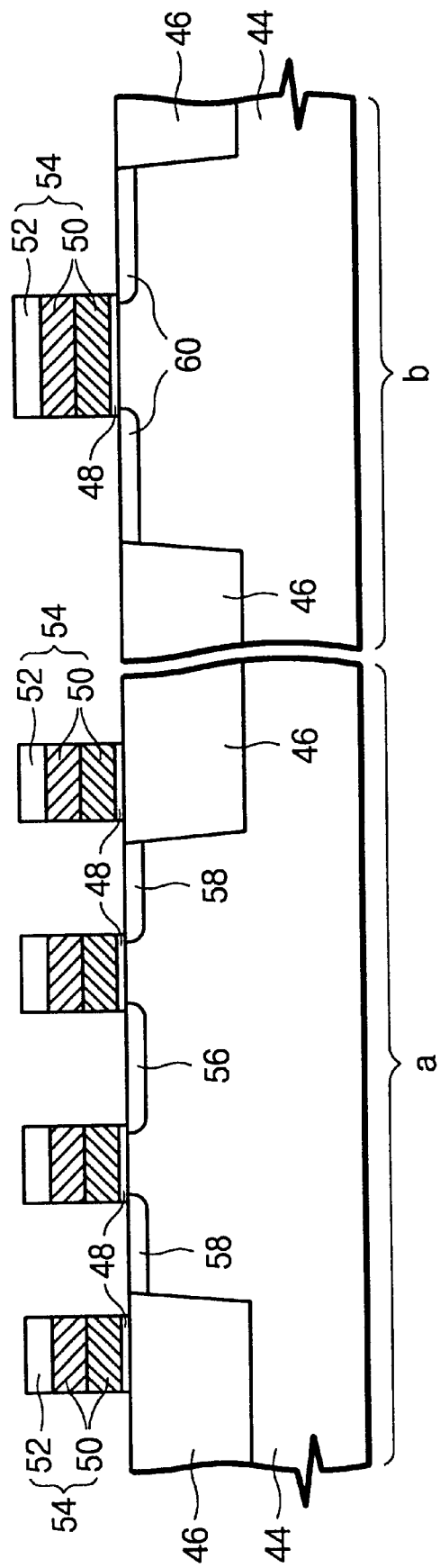
Figure 4B:
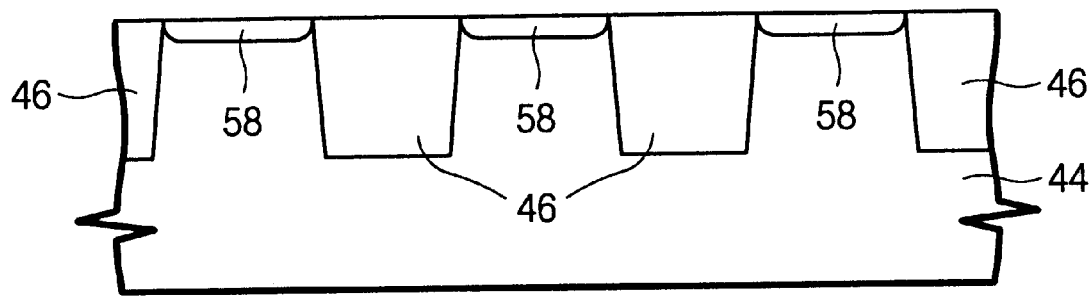
Figure 4C:
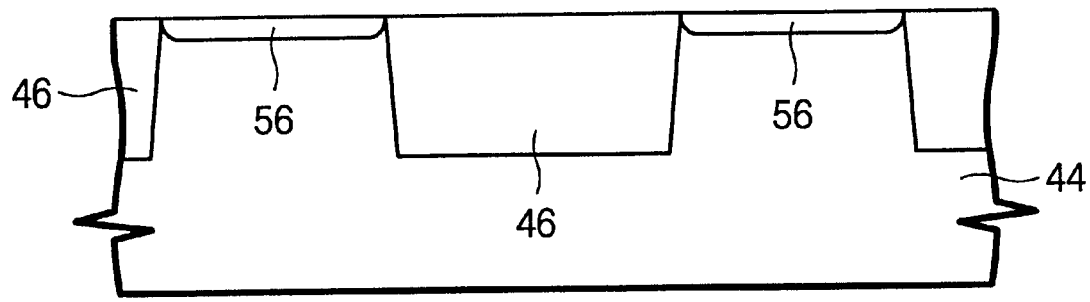

Referring now to FIGS. 4A, 4B and 4C, an isolation layer 46 is formed in a predetermined portion of a semiconductor substrate 44 to define active regions. The isolation layer 46 can be formed using a LOCOS (LOCal Oxidation of Silicon) technique or a STI (Shallow Trench Isolation) technique. The STI technique is preferably used in this embodiment. A gate insulating layer 48, a conductive layer, and a capping layer are sequentially formed on the resultant structure having the isolation layer 46. The gate insulating layer 48 is preferably formed of a thermal oxide layer. The conductive layer is formed of a composite layer of a polysilicon and metal silicide, i.e., formed of a polycide layer. Also, the capping layer is preferably formed of a silicon nitride layer. The capping layer and the conductive layer are sequentially patterned to form a plurality of interconnection patterns, i.e., gate patterns 54. Each of the gate patterns 54 comprises a gate electrode 50 and a capping layer pattern 52 which are sequentially stacked. The gate electrode 50 corresponds to a word line. At this time, another gate pattern 54 is also formed in a peripheral circuit region 'b'.

Using the gate patterns 54 and the isolation layer 46 as ion-implantation masks, impurities are implanted into the active region to form low concentration impurity regions. Accordingly, three low concentration impurity regions 56 and 58 are formed at each active region in the cell array region 'a'. Herein, the low concentration impurity region 56 at a central part of the active region acts as a common drain region of a pair of cell transistors, and the two low concentration regions 58 at both sides of the common drain region act as source regions of the pair of cell transistors. In addition, low concentration source/drain regions 60 are also formed in the peripheral circuit region 'b'.

Figure 5A:
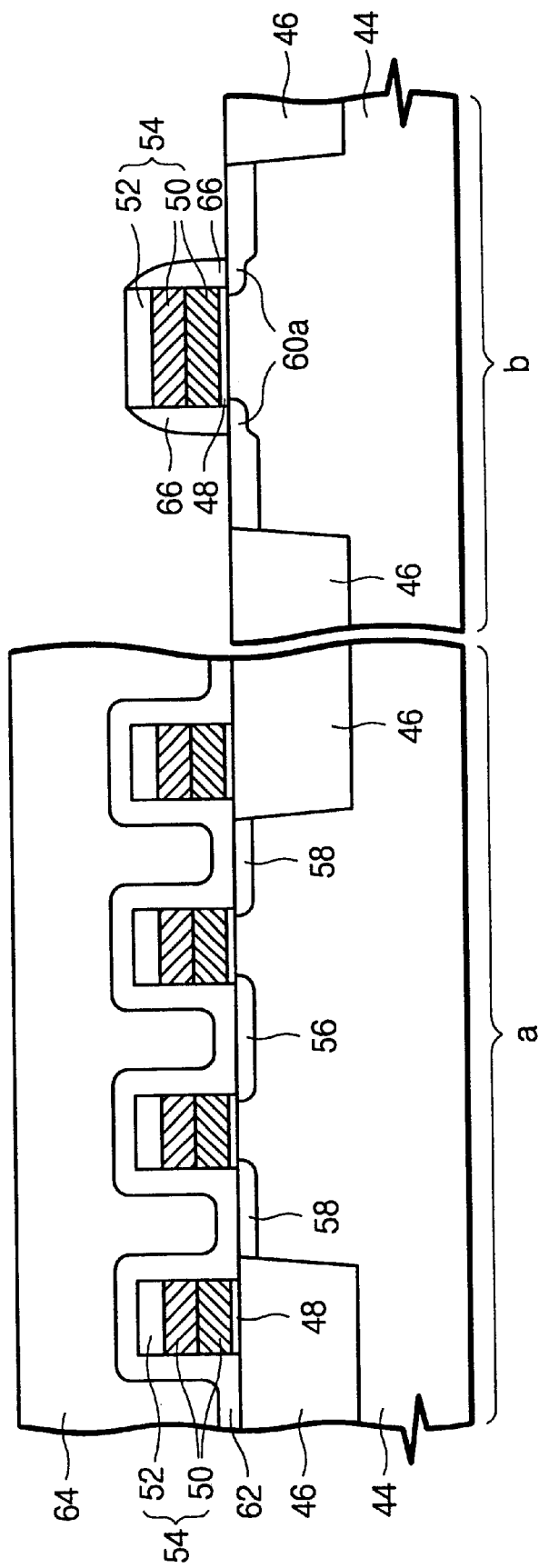
Figure 5B:
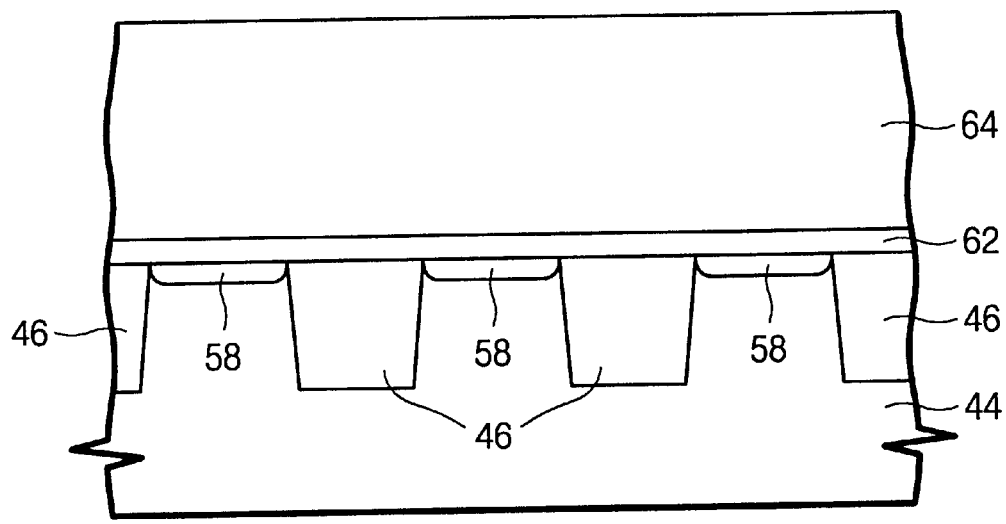
Figure 5C:
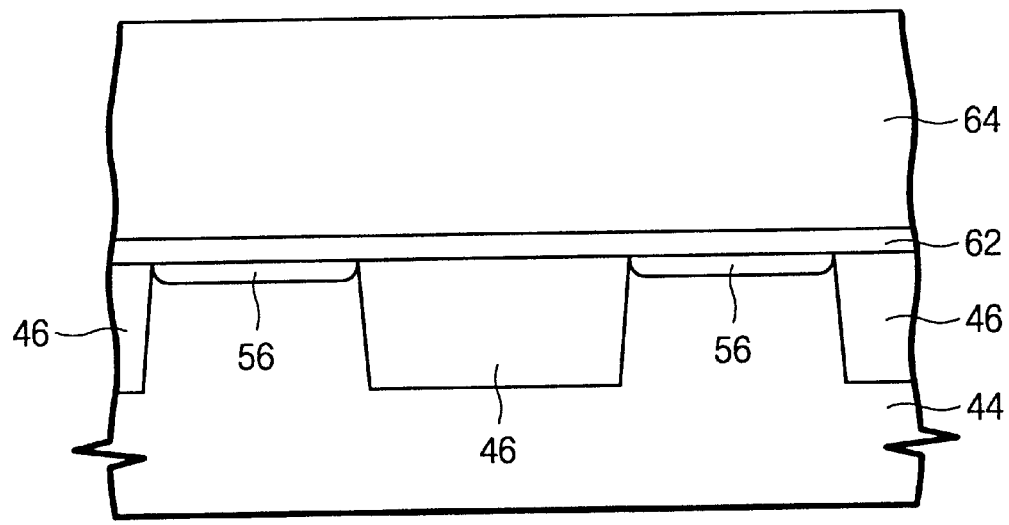

Referring now to FIGS. 5A, 5B and 5C, a conformal insulating layer 62 for a spacer is formed on the entire surface of the resultant structure having the low concentration impurity regions 56, 58 and 60. The insulating layer 62 is formed of a material that has an etching selectivity with respect to the subsequent interlayer insulating layer. For example, the insulating layer 62 is preferably formed of a silicon nitride layer. A photosensitive layer, i.e., photoresist layer, is formed on the resultant having the insulating layer 62. A photolithography process is then performed to form a photoresist pattern 64 exposing the insulating layer 62 in the peripheral circuit region 'b'. Subsequently, the exposed insulating layer 62 is anisotropically etched to form a spacer 66 on sidewalls of the gate patterns 54 in the peripheral circuit region 'b'. Using the photoresist pattern 64, the gate pattern 54 and the spacer 66 in the peripheral circuit region 'b' as implantation masks, impurities are implanted into the peripheral circuit region 'b' to form LDD type source/drain regions 60a in the peripheral region 'b'.

Figure 6A:
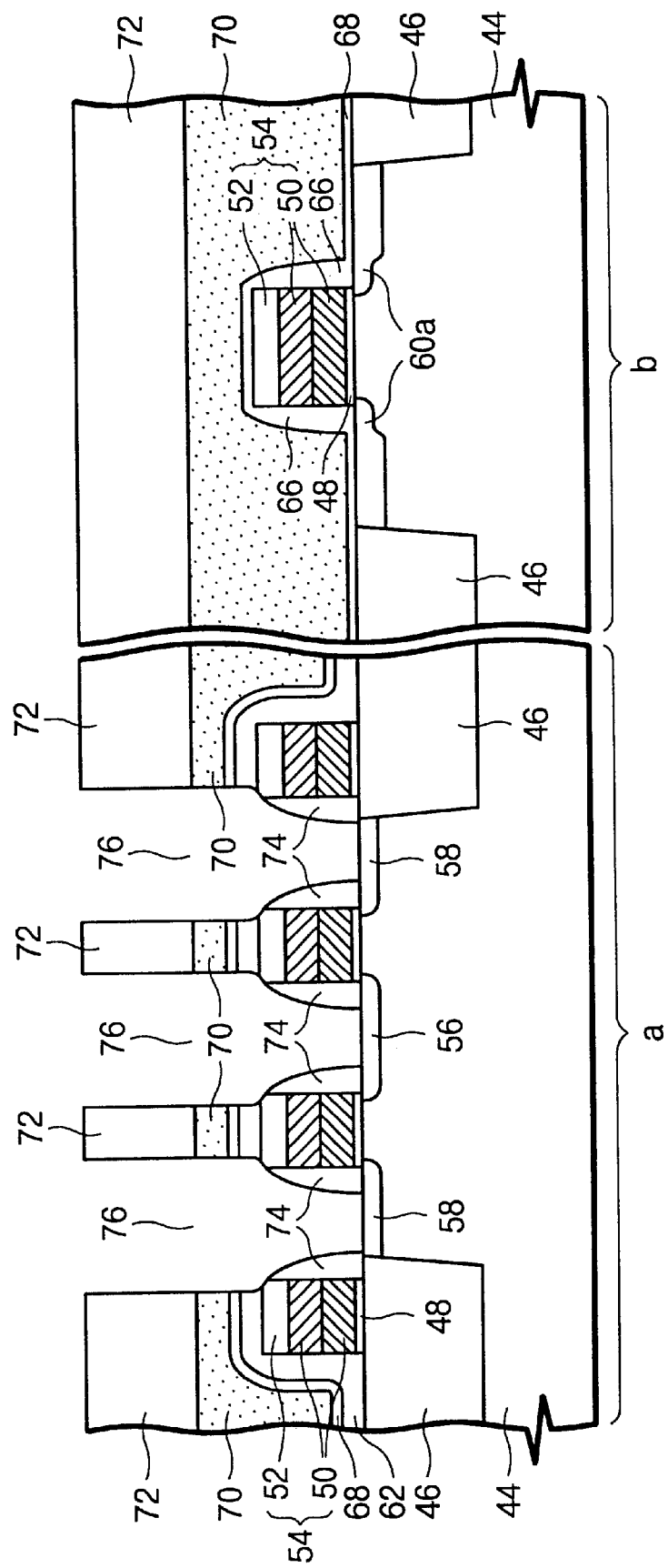
Figure 6B:
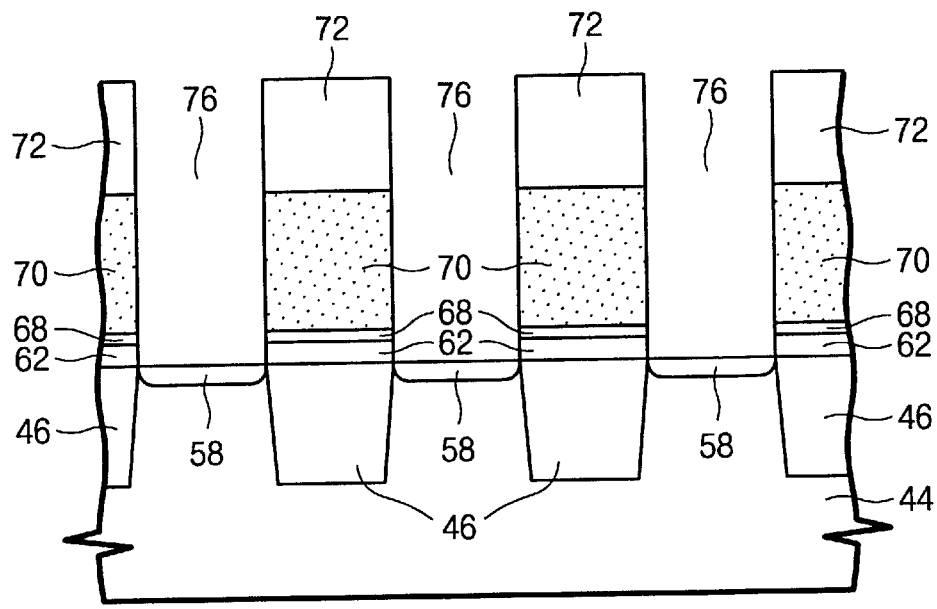
Figure 6C:
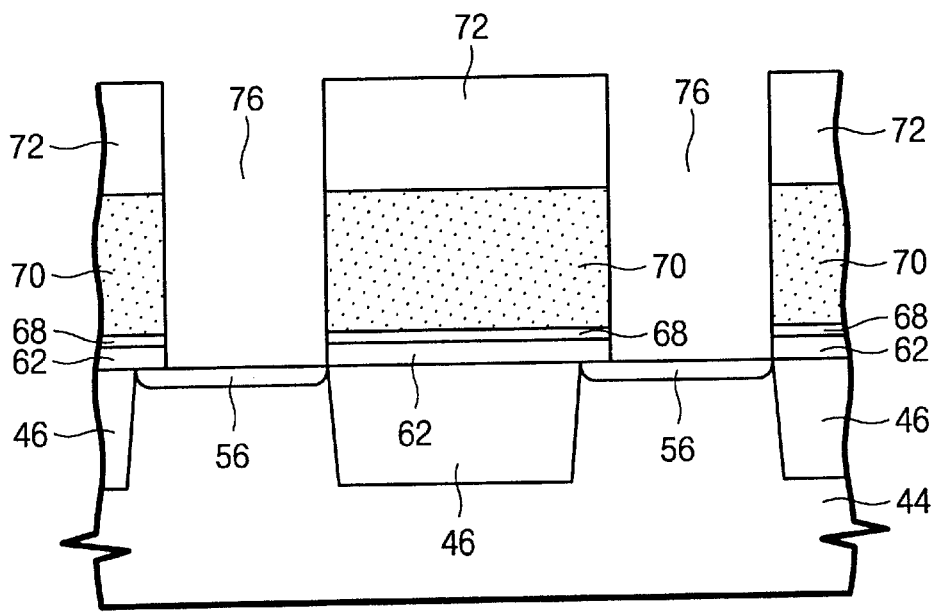

Referring to FIGS. 6A, 6B and 6C, after removing the photoresist pattern 64, a conformal etch stop layer 68 and an interlayer insulating layer 70 are sequentially formed on an entire surface of the semiconductor substrate 44. Preferably, the etch stop layer 68 is formed of a silicon nitride layer. Also, the interlayer insulating layer 70 is formed of a silicon oxide layer containing impurities. For example, the interlayer insulating layer 70 is formed of a BPSG layer and then is annealed to reflow for planarization. As a result, gap regions between the gate patterns 54 in the cell array region 'a' can be completely filled without any void. At this time, the etch stop layer 68 serves as a diffusion barrier layer for preventing impurities in the interlayer insulating layer 70 from being diffused into the low concentration impurity regions 56 and 58 of the cell array region 'a' and into the source/drain regions 60a of the peripheral circuit region 'b'.

A photoresist pattern 72 is then formed on the interlayer insulating layer 70 to expose selected regions of the cell array region 'a'. Using the photoresist pattern 72 as an etching mask, the BPSG layer 70 is selectively and anisotropically etched until the etch stop layer 68 is exposed. Subsequently, the exposed etch stop layer 68 and the insulating layer 62 are sequentially and anisotropically etched to form spacers 74 on sidewalls of the gate patterns 54 of the cell array region 'a' while concurrently forming pad contact holes 76 exposing the low concentration impurity regions 56 and 58. Most preferably, the pad contact holes 76 are formed by the two step etching process including a first etching step for selectively etching the interlayer insulating layer 70 with respect to the etch stop layer 68 and a second etching step for selectively etching the etch stop layer 68 and the insulating layer 62. Accordingly, the gate electrodes 50 of the cell array region 'a', i.e., word lines can be protected from being exposed, even though the misalignment occurs during a photolithography process for forming the photoresist pattern 72. Namely, the pad contact holes 76 are formed through a self-aligned contact process.

Figure 7B:
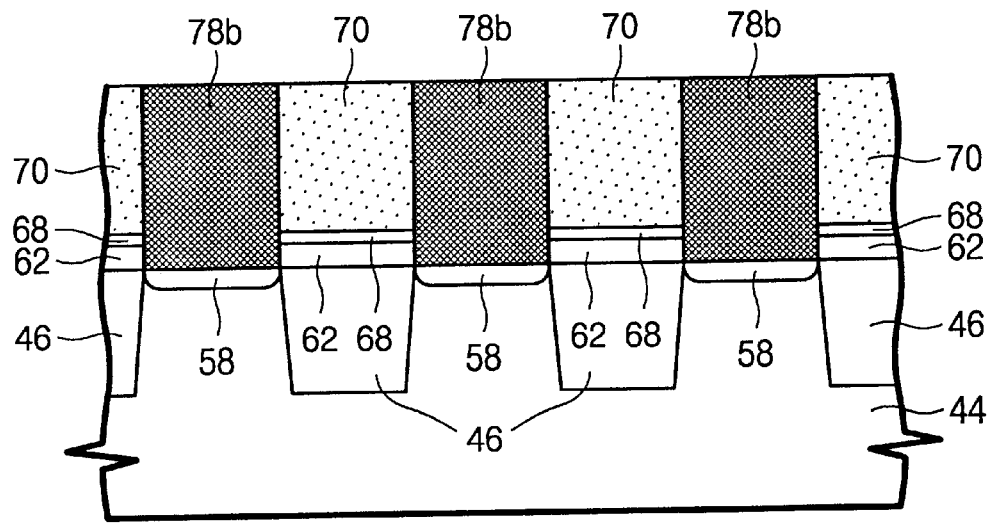
Figure 7C:
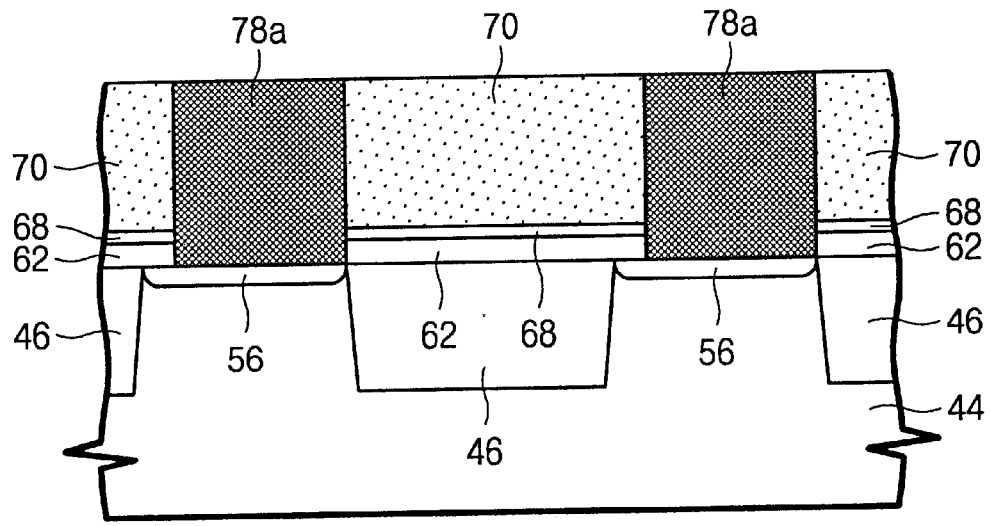

Referring to FIGS. 7A, 7B and 7C, after removing the photoresist pattern 72, a conductive material layer is formed on the resultant to fill the pad contact holes 76. Preferably, the conductive material layer is formed of a doped polysilicon layer. The conductive material layer is then etched back until a top surface of the interlayer insulating layer 70 is exposed, to form conductive pads 78a and 78b in the pad contact holes 76. Herein, the conductive pad 78a formed on the common drain region 56 corresponds to a bit line pad, and the conductive pads 78b formed on the source regions 58 correspond to storage node pads.

Figure 8A:
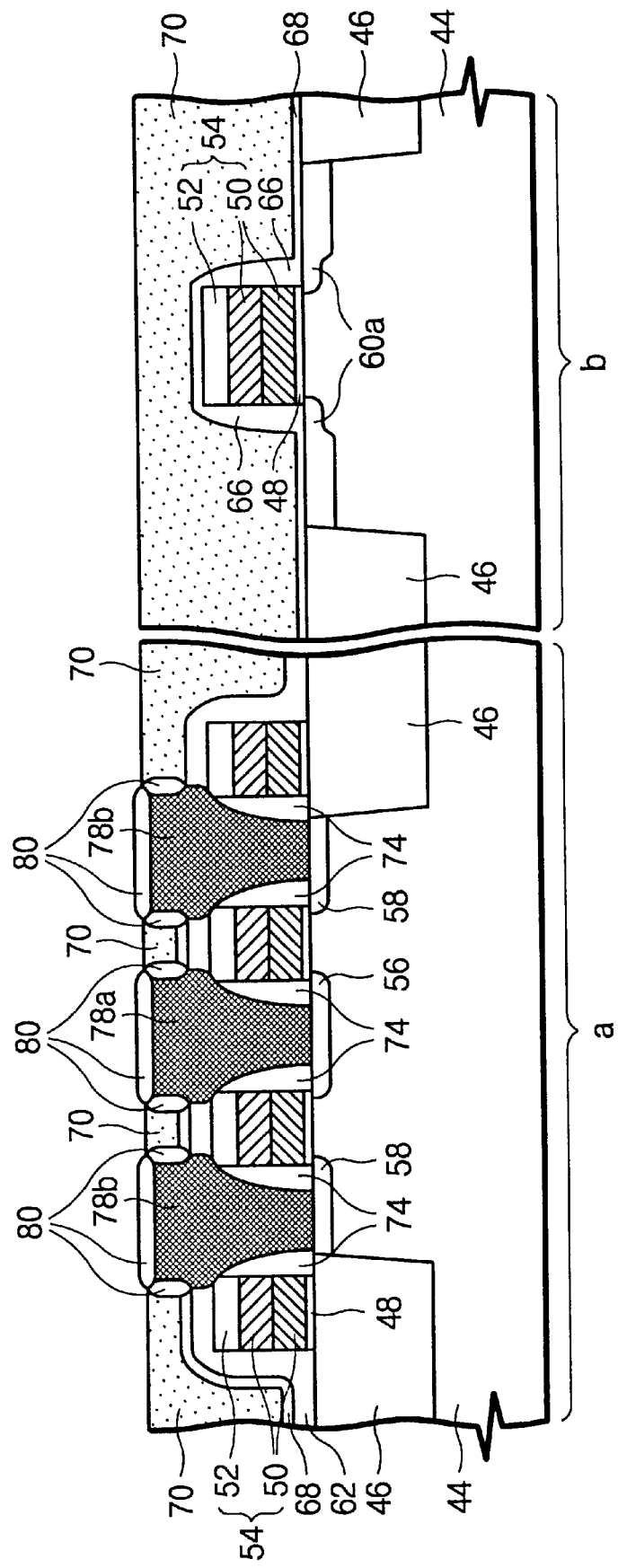
Figure 8B:
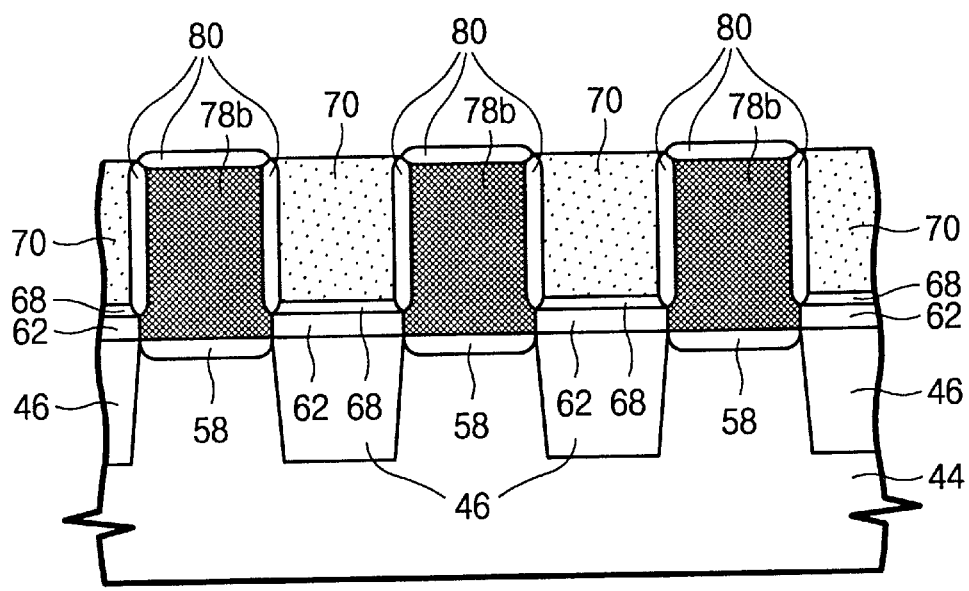
Figure 8C:
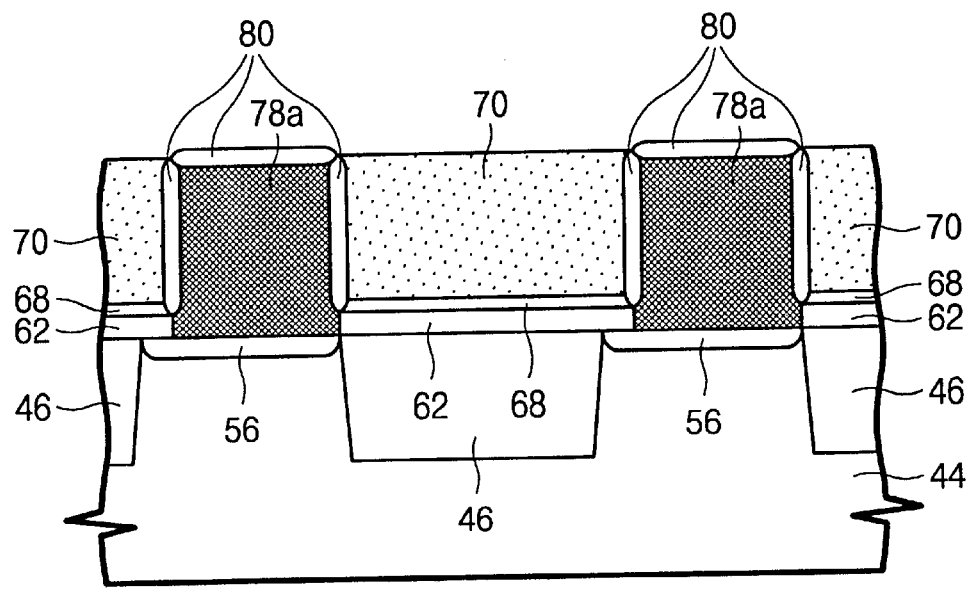

Referring to FIGS. 8A, 8B and 8C, the resultant having the conductive pads 78a and 78b is thermally oxidized in $H_2O$ and $O_2$ ambient gas. The thermal oxidation is preferably performed at a temperature of about 600° C. to 800° C. As a result, a thermal oxide layer 80 is formed on a top surface of the conductive pads 78a and 78b and at the interfaces between the conductive pads 78a and 78b and the interlayer insulating layer 70. Herein, since the oxygen diffusivity within the interlayer insulating layer 70, i.e., within the BPSG layer is very high, the thermal oxide layer 80 can be very easily formed on the sidewalls of the conductive pads 78a and 78b. On the contrary, the thermal oxide layer 80 is not formed at the interface between the conductive pads 78a and 78b and the silicon nitride spacers 74 of the cell array region 'a'.

Since the conductive pads 78a and 78b are formed of a doped polysilicon layer, the oxidation rate of the conductive pads 78a and 78b is faster as compared to an undoped polysilicon layer. Accordingly, the sidewalls of the conductive pads 78a and 78b are easily oxidized before the impurities in the interlayer insulating layer 70 are diffused into the conductive pads 78a and 78b. The thermal oxide layer 80 formed on the sidewalls of the conductive pads 78a and 78b acts as a diffusion barrier layer that prevents the impurities in the interlayer insulating layer 70 from being diffused into the conductive pads 78a and 78b during a subsequent annealing process.

Figure 9A:
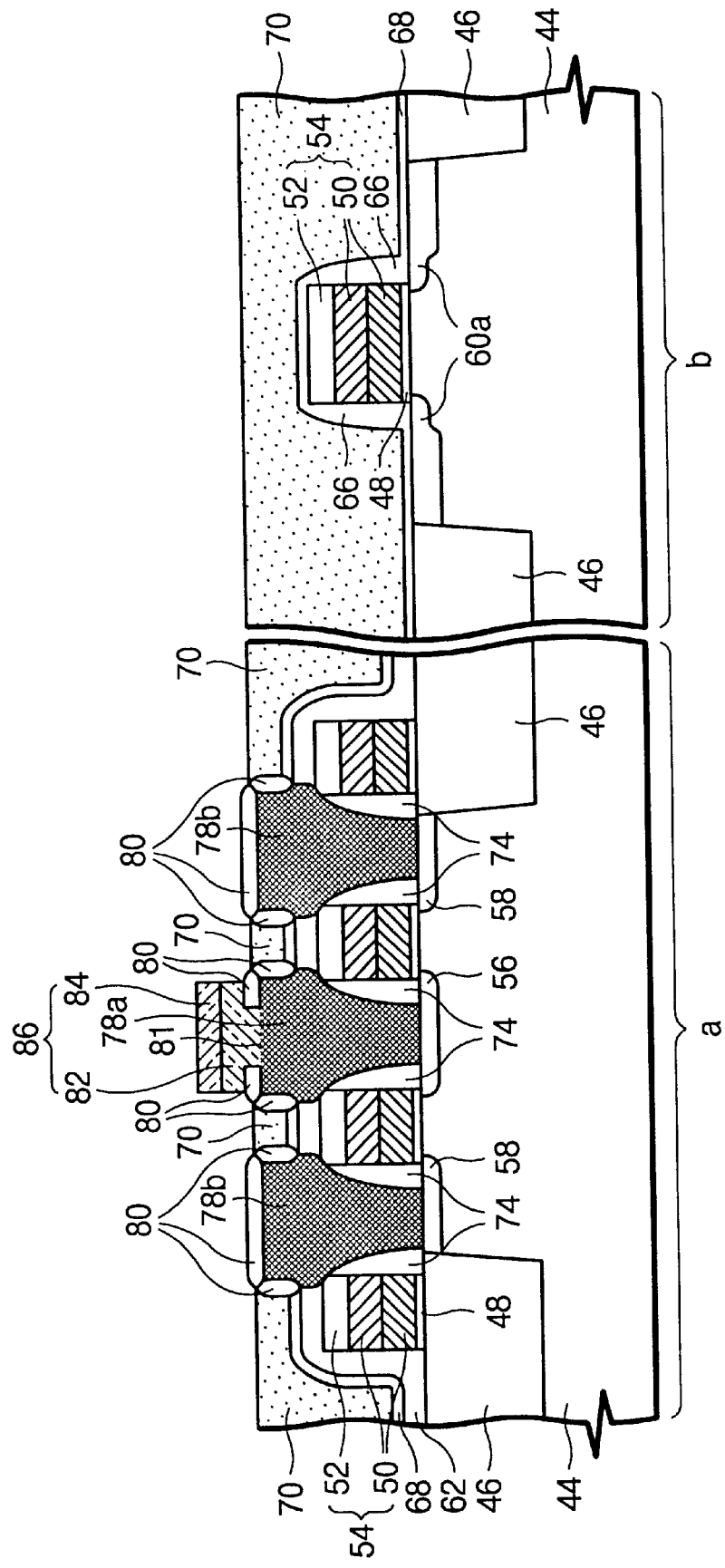
Figure 9B:
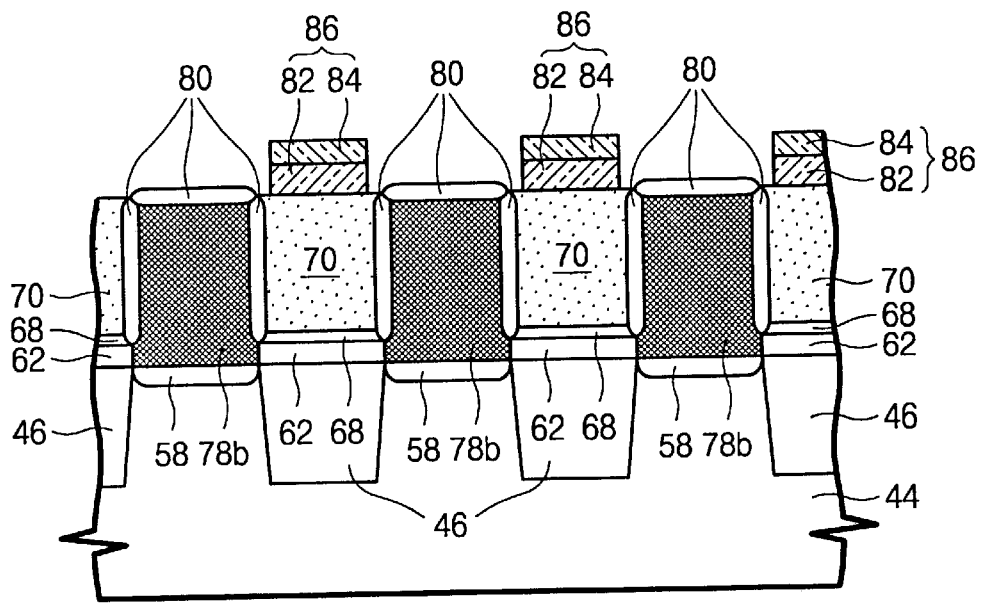
Figure 9C:
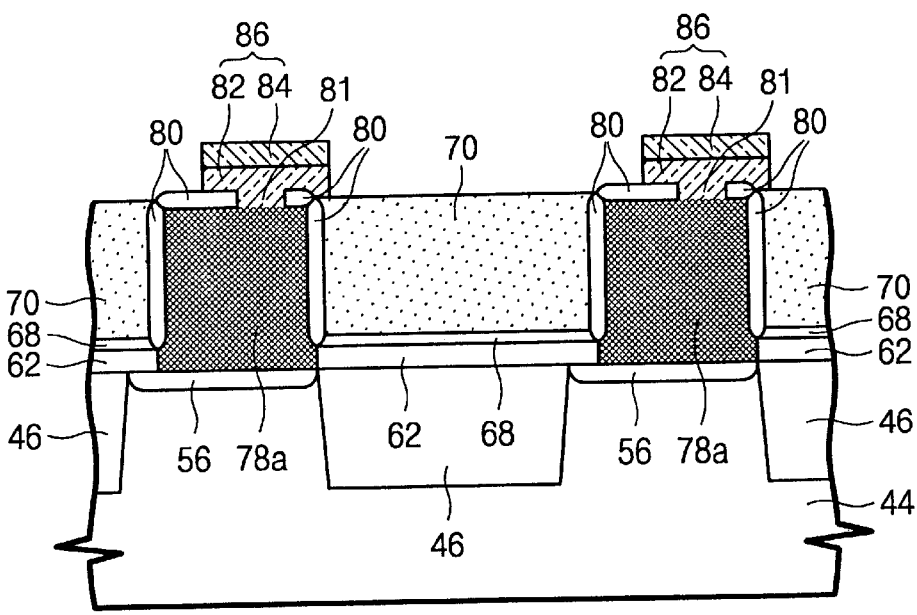

Referring to FIGS. 9A, 9B and 9C, a photoresist layer is coated on the resultant having the thermal oxide layer 80. The photoresist layer is then patterned through a photolithographic process to form a photoresist pattern (not shown) exposing the thermal oxide layer 80 on the bit line pad 78a. Using the photoresist pattern as an etching mask, the exposed thermal oxide layer 80 is etched to form a bit line contact hole 81 exposing the bit line pad 78a. After removing the photoresist pattern, a conductive layer is formed on the resultant structure. Preferably, the conductive layer is formed of a polycide layer, i.e., a composite layer including a polysilicon layer and a metal silicide layer. The polycide layer is then patterned to form a bit line 86. The bit line 86 comprises a polysilicon pattern 82 covering the bit line contact hole 81 and a metal silicide pattern 84 stacked on the polysilicon pattern 82. At this time, the thermal oxide layer 80 on the storage node pads 78b serves as an etch stop layer during a dry etching process for forming the bit line 86, thereby preventing the storage node pads 78b from being etched.

Figure 10A:
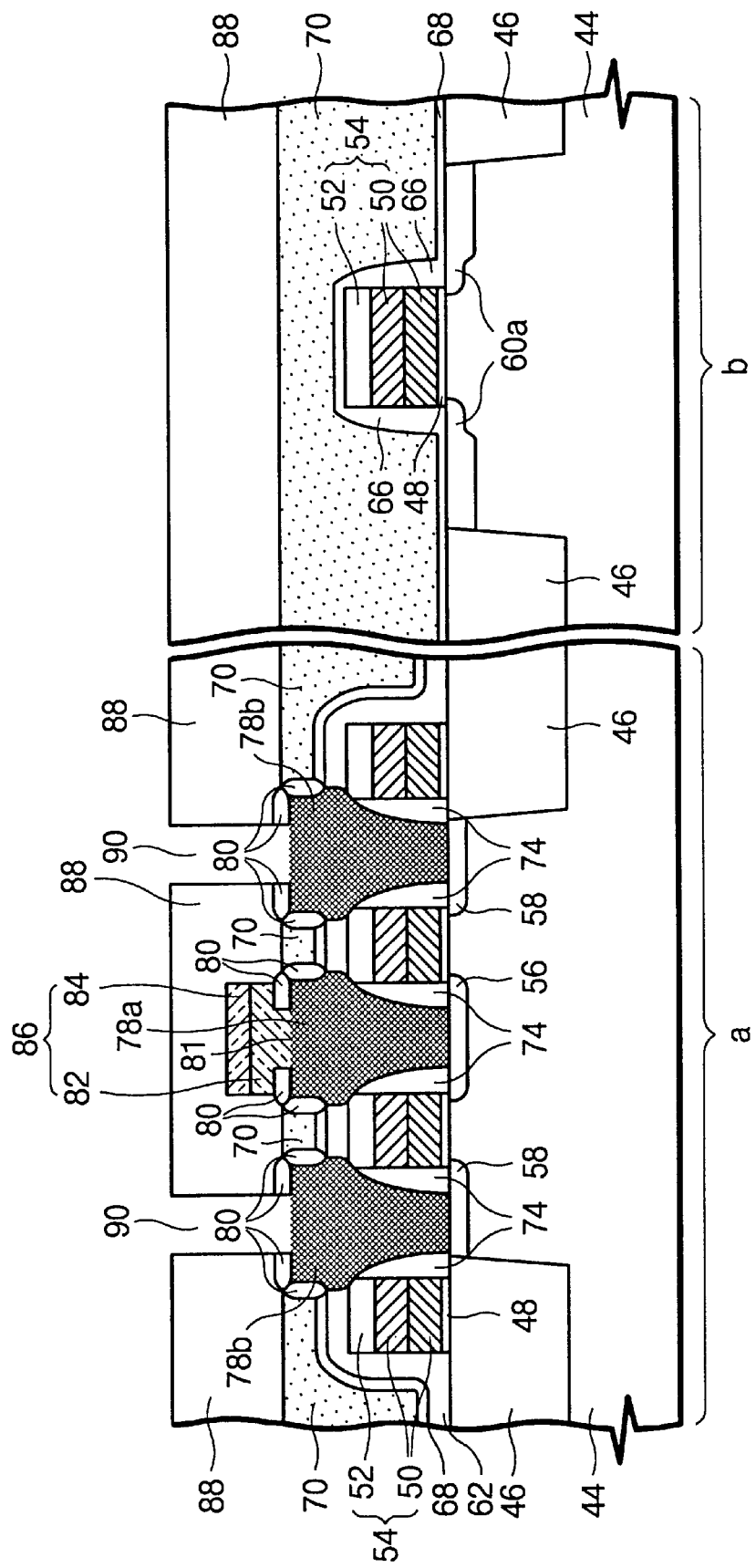
Figure 10B:
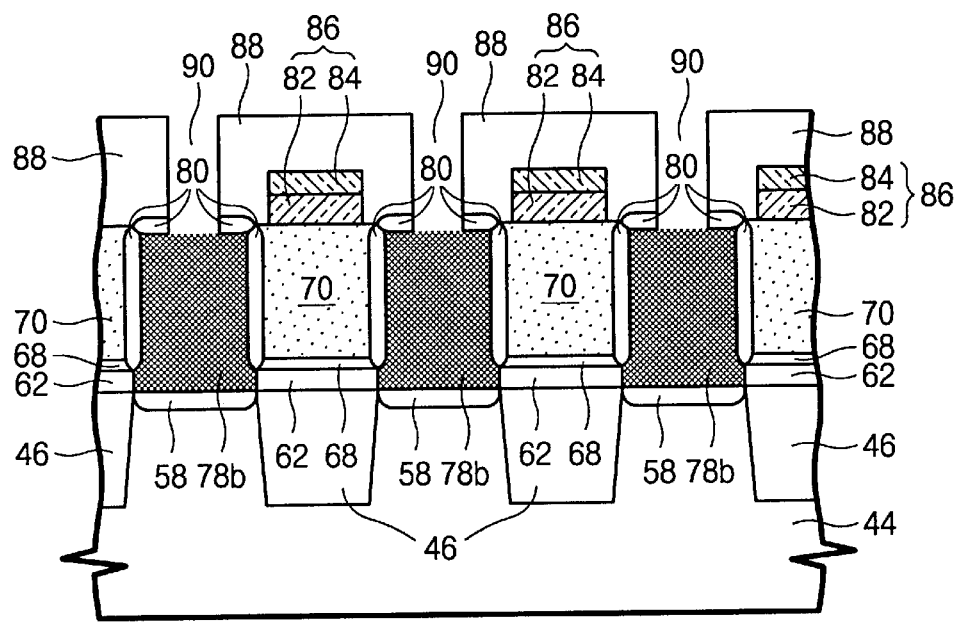
Figure 10C:
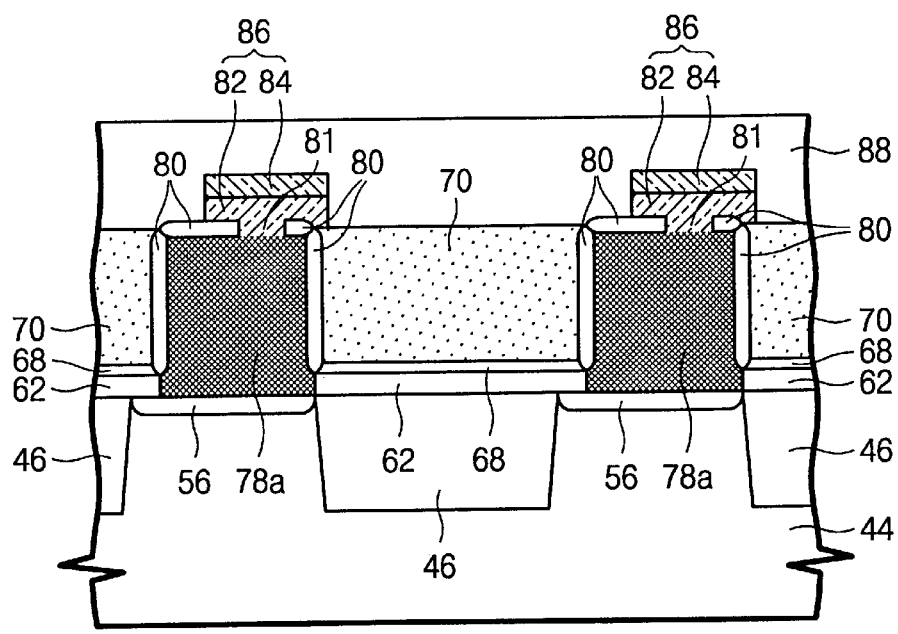

Referring to FIGS. 10A, 10B and 10C, an insulating layer 88 is formed on the resultant structure having the bit line 86. The insulating layer 88 is formed of a conventional oxide layer. The insulating layer 88 and the thermal oxide layer 80 are sequentially patterned to form storage node contact holes 90 exposing the storage node pads 78b. Though not shown in the figure, storage nodes, which are electrically connected to the storage node pads 78b through the storage node contact holes 90, are formed using a conventional technique.

As described above, according to the present invention, a thermal oxide layer is formed at the interfaces between the conductive pads and the interlayer insulating layer by thermally oxidizing the resultant structure having the conductive pads penetrating the interlayer insulating layer containing impurities. Accordingly, the thermal oxide layer prevents impurities within the interlayer insulating layer from being diffused into the source/drain region through the conductive pad during the subsequent thermal process. As a result, it is possible to suppress the degradation of electrical characteristics of the semiconductor device.

In addition, according to the present invention, the thermal oxide layer is also formed on the top surface of the storage node pad as well as on the top surface of the bit line pad. Accordingly, there is no need to form an extra insulating layer for electrical isolation between the bit line and the storage node pads. As a result, the manufacturing process can be simplified.

Furthermore, according to the present invention, the thin etch stop layer is interposed between the source/drain regions of the peripheral circuit region and the interlayer insulating layer. Accordingly, it is possible to prevent the impurities in the interlayer insulating layer from being diffused out into the source/drain region.

What is claimed is:

1. A method of forming a contact structure in a semiconductor device comprising:

forming an interlayer insulating layer containing impurities on a semiconductor substrate;

patterning the interlayer insulating layer to form a pad contact hole exposing a predetermined portion of the semiconductor substrate;

forming a conductive pad in the pad contact hole; and thermally oxidizing the resultant structure having the conductive pad to form an oxide layer on a top surface of the conductive pad and at an interface between the conductive pad and the interlayer insulating layer.

2. The method according to claim 1, wherein prior to forming the interlayer insulating layer, the method comprises:

forming a plurality of parallel interconnection patterns on the semiconductor substrate; and forming a conformal etch stop layer on the entire surface of the resultant structure having the interconnection patterns.

3. The method according to claim 2, wherein forming the plurality of parallel interconnection patterns comprises:

forming an insulating layer on the semiconductor substrate;

sequentially forming a conductive layer and a capping insulating layer on the insulating layer; and sequentially patterning the capping insulating layer and the conductive layer.

4. The method according to claim 2, wherein the etch stop layer is formed of a silicon nitride layer.

5. The method according to claim 2, further comprising forming a low concentration impurity region at the semiconductor substrate which is located at both sides of the interconnection patterns.

6. The method according to claim 1, wherein the interlayer insulating layer is formed of an oxide layer containing impurities.

7. The method according to claim 6, wherein the oxide containing impurities is formed of a BPSG (borophosphorsilicate glass) layer.

8. The method according to claim 1, wherein the thermal oxidation is performed at a temperature of about 600° C. to 800° C.

9. The method according to claim 1, wherein the thermal oxidation is performed in ambient gases of $H_2O$ and $O_2$.

10. The method according to claim 1, wherein the conductive pad is formed of a doped polysilicon layer.

11. A method of forming a contact structure in a semiconductor device having a cell array region and a peripheral region, the method comprising:

forming an isolation layer at a predetermined portion of a semiconductor substrate to define active regions;

forming a gate insulating layer on the active regions;

sequentially forming a conductive layer and a capping insulating layer on the resultant stricture having the gate insulating layer;

sequentially patterning the capping insulating layer and the conductive layer to form a plurality of parallel word line patterns crossing over the active regions in the cell array region and to form at least one gate pattern crossing over the active region in the peripheral region;

forming an insulating layer on the resultant structure having the word line patterns and the gate pattern;

forming a photoresist pattern to expose the peripheral region;

anisotropically etching the insulating layer using the photoresist pattern as an etching mask to form a spacer on a sidewall of the gate pattern;

removing the photoresist pattern;

forming an etch stop layer on the resultant structure where the phtoresist pattern is removed;

forming an interlayer insulating layer on the etch stop layer to fill gap regions between the word line patterns, the interlayer insulating layer containing impurities;

sequentially patterning the interlayer insulating layer, the etch stop layer and the insulating layer to form a plurality of pad contact holes exposing the active region in the cell array region;

forming conductive pads in the pad contact holes; and thermally oxidizing the resultant structure having the conductive pads, thereby forming a thermal oxide layer on a top surface of the conductive pad and at an interface between the conductive pad and the interlayer insulating layer.

12. The method according to claim 11, further comprising implanting impurities into the active region using the word line patterns and the gate pattern as implantation masks to form a common drain region and source regions at the active region in the cell array region and to concurrently form a low concentration impurity regions at the active region in the peripheral region, prior to formation of the insulating layer, wherein the pad contact holes expose the common drain region and the source regions, wherein the pad contact hole exposing the common drain region is a bit line pad contact hole and the pad contact hole exposing the source regions is a storage node pad contact hole, wherein the conductive pad in the bit line pad contact hole is a bit line pad, and the conductive pad in the storage node pad contact hole is a storage node pad.

13. The method according to claim 12, further comprising:

patterning the thermal oxide layer on the top surface of the bit line pad to form a bit line contact hole exposing the bit line pad;

forming a bit line covering the bit line contact hole;

forming an insulating layer on the resultant having the bit line;

patterning the insulating layer to form a storage node contact hole exposing the storage node pad; and forming a storage node electrically connected to the storage node pad through the storage node contact hole.

* * * * *